(12) United States Patent
Manens et al.

(10) Patent No.: US 8,129,658 B2
(45) Date of Patent: Mar. 6, 2012

(54) SYSTEMS FOR THIN FILM LASER SCRIBING DEVICES

(75) Inventors: Antoine P. Manens, Saratoga, CA (US); Wei-Sheng Lei, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/851,422

(22) Filed: Aug. 5, 2010

(65) Prior Publication Data

US 2011/0033970 A1 Feb. 10, 2011

Related U.S. Application Data

(60) Provisional application No. 61/231,941, filed on Aug. 6, 2009.

(51) Int. Cl.
*B23K 26/00* (2006.01)

(52) U.S. Cl. ......... 219/121.72; 219/121.67; 219/121.68; 219/121.69

(58) Field of Classification Search .............. 219/121.67, 219/121.68, 121.69, 121.72, 85.2; 136/252–255, 136/256, 259, 246–249, 260–262; 438/95
See application file for complete search history.

(56) References Cited

U.S. PATENT DOCUMENTS 5,945,163 A    8/1999 Powell et al.
(Continued)

FOREIGN PATENT DOCUMENTS

EP    0482240 A1    4/1992
(Continued)

*Primary Examiner* — Dung A. Le
(74) *Attorney, Agent, or Firm* — Kilpatrick Townsend & Stockton LLP

(57) ABSTRACT

Methods and related systems for fabricating a solar-cell assembly are provided. An example method comprises forming a series of layers and scribing a series of aligned interconnect lines in the layers prior to forming any isolation line related features. The example method provides for the use of contiguously-scribed interconnect lines as compared to an existing method where at least one interconnect line is segmented to avoid scribing through a previously-formed isolation line related feature located where an isolation line is to be scribed. The ability to use contiguously-scribed interconnect lines may improve the throughput of the fabrication process.

8 Claims, 19 Drawing Sheets

U.S. PATENT DOCUMENTS

| | | | |
|---|---|---|---|
| 6,037,241 A | 3/2000 | Powell et al. | |
| 6,058,740 A | 5/2000 | McMaster et al. | |
| 6,300,593 B1 | 10/2001 | Powell | |
| 6,599,411 B2 | 7/2003 | Dinan et al. | |
| 6,719,848 B2 | 4/2004 | Faykosh et al. | |
| 6,919,530 B2 | 7/2005 | Borgeson et al. | |
| 7,259,321 B2 | 8/2007 | Oswald et al. | |
| 2002/0063115 A1 | 5/2002 | Kim et al. | |
| 2006/0103371 A1 | 5/2006 | Manz | |
| 2008/0012189 A1 | 1/2008 | Manz | |
| 2008/0105295 A1 | 5/2008 | Manz | |
| 2009/0000108 A1 | 1/2009 | Manz | |
| 2009/0188543 A1 | 7/2009 | Bann | |
| 2009/0229653 A1 | 9/2009 | Lu et al. | |
| 2009/0321397 A1* | 12/2009 | Krishnaswami et al. | 219/121.68 |
| 2009/0321399 A1 | 12/2009 | Inagawa et al. | |
| 2010/0314367 A1* | 12/2010 | Shamoun et al. | 219/121.72 |

FOREIGN PATENT DOCUMENTS

| | | |
|---|---|---|
| EP | 1918101 A1 | 5/2008 |
| JP | 62-168689 A | 7/1987 |
| JP | 05102639 A | 4/1993 |
| JP | 2002-076402 A | 3/2002 |
| JP | 2006136913 A | 6/2006 |
| JP | 2007-222897 A | 9/2007 |
| JP | 2007-237242 A | 9/2007 |
| JP | 2008-080346 A | 4/2008 |
| KR | 10-2005-0026253 A | 3/2005 |
| KR | 20-0422239 | 7/2006 |
| WO | WO 94/29268 | 12/1994 |
| WO | WO 2007/144565 A2 | 12/2007 |
| WO | WO 2008/056116 A1 | 5/2008 |
| WO | WO 2009/030409 A2 | 3/2009 |

* cited by examiner

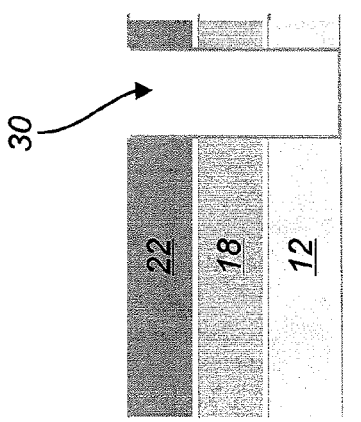
FIG. 8A
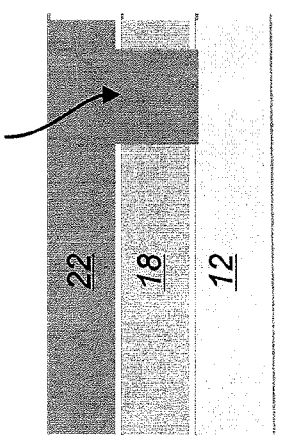
FIG. 8C
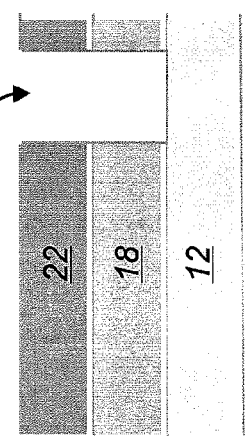
FIG. 8E
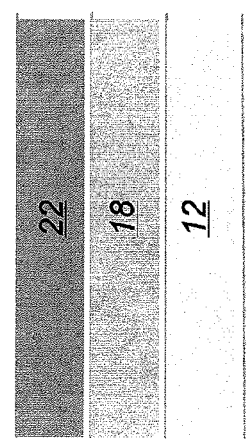
FIG. 8B
FIG. 8D

| PROCESS | CATEGORY OF SCRIBED LINES | | | | NOTE |
|---|---|---|---|---|---|
| | LINE FOR ELECTRICAL INTERCONNECT | | LINE FOR ELECTRICAL ISOLATION | | |
| | EXISTING SEQUENCE | NEW SEQUENCE | EXISTING SEQUENCE | NEW SEQUENCE | |
| P1 | YES; CONTINUOUS | YES; CONTINUOUS | YES (PULSE ENERGY = 50 TO 150 uJ, PRF >= 40 kHz, PULSE WIDTH = 20 TO 200 ns) | NO | |
| P2 | YES; SKIP ISOLATION LINES | YES; CONTINUOUS | NO | NO | |
| P3 | YES; CONTINUOUS | YES; CONTINUOUS | YES (PULSE ENERGY = 5 TO 15 uJ, PRF = 40 kHz, PULSE WIDTH = 5 to 75 ns) | YES (PULSE ENERGY = 50 TO 1000 uJ, PRF >= 40 kHz, PULSE WIDTH = 5 to 75 ns) | P3 ISOLATION LINE SCRIBING THE LAST STEP IN BOTH THE EXISTING SEQUENCE AND THE NEW SEQUENCE |

SYSTEMS FOR THIN FILM LASER SCRIBING DEVICES

CROSS-REFERENCES TO RELATED APPLICATIONS

This application claims the benefit of U.S. Prov. Patent Application No. 61/231,941 filed Aug. 6, 2009, and titled "METHODS AND RELATED SYSTEMS FOR THIN-FILM LASER SCRIBING WITH ENHANCED THROUGHPUT," which is incorporated herein by reference for all purposes.

BACKGROUND

Various embodiments described herein relate generally to fabrication of assemblies where a number of layers are deposited on a substrate and a number of lines are scribed in the layers, and more particularly to methods and related systems for fabricating assemblies by sequencing the deposition of layers and the scribing of lines so as to enhance throughput. These methods and related systems may be particularly effective for laser scribing thin-film single junction and multi junction solar cells.

An existing fabrication sequence used for forming thin-film solar cells involves depositing or otherwise forming a plurality of layers on a substrate, such as a glass, metal or polymer substrate suitable to form one or more p-n junctions. An example thin-film solar cell includes a transparent-conductive-oxide (TCO) layer, a plurality of doped and undoped silicon layers, and a metal back layer. A series of laser-scribed lines can be used to create individual cells connected in series. Examples of materials that can be used to form solar cells, along with methods and apparatus for forming the cells, are described, for example, in U.S. Pat. No. 7,582,515, issued Sep. 1, 2009, entitled "MULTI-JUNCTION SOLAR CELLS AND METHODS AND APPARATUSES FOR FORMING THE SAME," which is hereby incorporated herein by reference.

FIGS. 1A through 1E illustrate an existing fabrication sequence for a thin-film solar-cell assembly where a number of layers are deposited on a substrate and a series of lines are laser scribed within the layers to delineate individual cells. FIG. 1A illustrates the first step in the existing fabrication sequence, where a TCO layer 12 is deposited on a glass substrate 10. FIG. 1B illustrates the second step, where a first set of lines 14, 16 (herein referred to as "P1" interconnect lines and "P1" isolation lines, respectively) are laser scribed in the TCO layer 12. FIG. 1C illustrates the third step, where a plurality of doped and undoped amorphous silicon (a-Si) layers 18 are deposited on top of the TCO layer 12 and within the scribed P1 lines 14, 16. FIG. 1D illustrates the fourth step, where a second set of lines 20 ("P2" lines) are laser scribed in the silicon layers 18. FIG. 1E illustrates the fifth step, where a metal layer 22 is deposited on top of the silicon layers 18 and within the scribed P2 lines 20. FIG. 1E also illustrates the sixth step, where a third set of lines 24, 26 ("P3" interconnect lines and "P3" isolation lines, respectively) are laser scribed as illustrated.

The fabrication of such an assembly contributes to total cost of a solar cell. While other factors beyond cost of production (e.g., quality of an item produced, overhead costs, etc.) are important considerations, lower production costs are desirable. Accordingly, it is desirable to develop improved methods and related systems having reduced production costs for fabricating solar panels. Additionally, such a need for improved methods and related systems may also exist for other manufacturing processes involving the deposition of layers and the scribing of lines within the layers.

BRIEF SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

Methods and related systems in accordance with many embodiments provide for the fabrication of solar-cell assemblies and other such assemblies using a fabrication sequence with enhanced throughput. These methods and related systems may be particularly effective for the fabrication of laser-scribed thin-film multi junction solar cells.

In one aspect, a method for fabricating a solar-cell assembly is provided. The method comprises providing a workpiece comprising a substrate and a first layer, scribing one or more first interconnect lines into the first layer, depositing a second layer onto the first layer and into the one or more first interconnect lines, scribing one or more second interconnect lines into the second layer, depositing a third layer onto the second layer and into the one or more second interconnect lines, scribing one or more third interconnect lines into the second layer and the third layer, and scribing one or more isolation lines into the first, second, and third layers.

In another aspect, a system for fabricating a solar-cell assembly is provided. The system comprises a support mechanism for receiving a workpiece comprising a substrate and a first layer, at least one laser device each configured to direct a laser beam toward the workpiece, and a laser controller. The laser controller is operable to cause the at least one laser device to scribe one or more first interconnect lines into the first layer. After a second layer is deposited onto the first layer and into the one or more first interconnect lines, the laser controller is operable to cause the at least one laser device to scribe one or more second interconnect lines into the second layer. After a third layer is deposited onto the second layer and into the one or more second interconnect lines, the laser controller is operable to cause the at least one laser device to scribe one or more third interconnect lines into the second layer and the third layer, and scribe one or more isolation lines into the first, second, and third layers.

In another aspect, a method for fabricating a solar-cell assembly is provided. The method comprises providing a workpiece comprising a substrate and a first layer. The method also includes scribing one or more first interconnect lines into the first layer. The method further comprises, after a second layer is deposited onto the first layer and into the one or more first interconnect lines, scribing one or more second interconnect lines into the second layer. The method further comprises, after a third layer is deposited onto the second layer and into the one or more second interconnect lines, scribing one or more third interconnect lines into the second layer and the third layer, and scribing one or more isolation lines into the first, second, and third layers.

In another aspect, a system for fabricating a solar-cell assembly is provided. The system comprises a translation stage operable to support a workpiece and translate the supported workpiece in a longitudinal direction, an encoder operatively coupled with the translation stage so as to measure a position of the translation stage, a laser operable to generate output able to remove material from at least a portion of the workpiece, a laser switch coupled with the laser so as to control the timing of the laser output by triggering the laser output, and a controller operatively coupled with the translation stage, the encoder, and the laser switch. The controller is operable to trigger the laser switch in response to an encoder measured position of the translation stage to interrupt the formation of a laser-scribed line so as to skip over a previously-formed laser scribed line. In many embodiments, the controller comprises a processor and a computer-readable medium that includes instructions that when executed cause the processor to accomplish said triggering of the laser switch.

In another aspect, a system for fabricating a solar-cell assembly is provided. The system comprises a support mechanism for receiving a workpiece, a laser operable to generate output able to remove material from at least a portion of the workpiece, a laser switch coupled with the laser so as to control the timing of the laser output by triggering the laser output, a scanning device operable to control a position of the output from the laser, an encoder operatively coupled with the scanning device so as to measure a position of the scanning device, and a controller operatively coupled with the scanning device, the encoder, and the laser switch. The controller is operable to trigger the laser switch in response to an encoder measured position of the scanning device to interrupt the formation of a laser-scribed line so as to skip over a previously-formed laser scribed line. In many embodiments, the controller comprises a processor and a computer-readable medium that includes instructions that when executed cause the processor to accomplish said triggering of the laser switch.

For a fuller understanding of the nature and advantages of the present invention, reference should be made to the ensuing detailed description and accompanying drawings. Other aspects, objects and advantages of the invention will be apparent from the drawings and detailed description that follows.

BRIEF DESCRIPTION OF THE DRAWINGS

FIGS. 8A through 8D diagrammatically illustrate various layer configurations in which a P3 isolation line may be formed using the sequence of FIGS. 6A through 6D and FIG. 7, in accordance with many embodiments.

FIG. 8E diagrammatically illustrates a P3 isolation line configuration, in accordance with many embodiments.

FIG. 9 is a table comparing aspects of the improved scribing sequence of FIGS. 6A through 6D and FIG. 7 with the existing sequence of FIGS. 1A through 1E and FIG. 2, in accordance with many embodiments.

DETAILED DESCRIPTION

Methods and related systems in accordance with many embodiments provide for the fabrication of solar-cell assemblies and other such assemblies using a fabrication sequence with enhanced throughput. These methods and related systems may be particularly effective for the fabrication of laser-scribed thin-film multi junction solar cells.

Figure 1A:
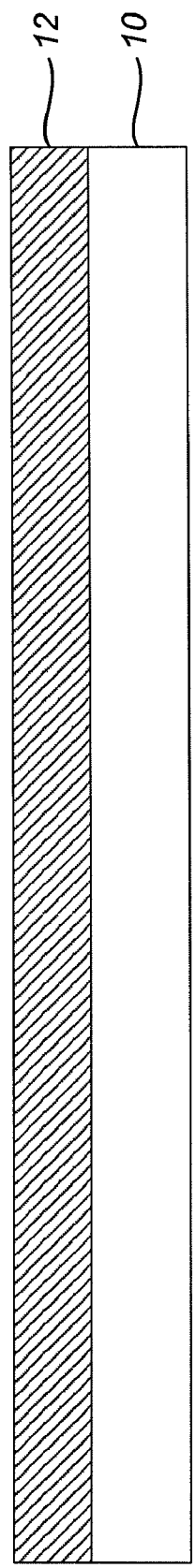
FIGS. 1A through 1E and FIG. 2 diagrammatically illustrate an existing sequence for fabricating a solar-cell assembly.
Figure 1B:
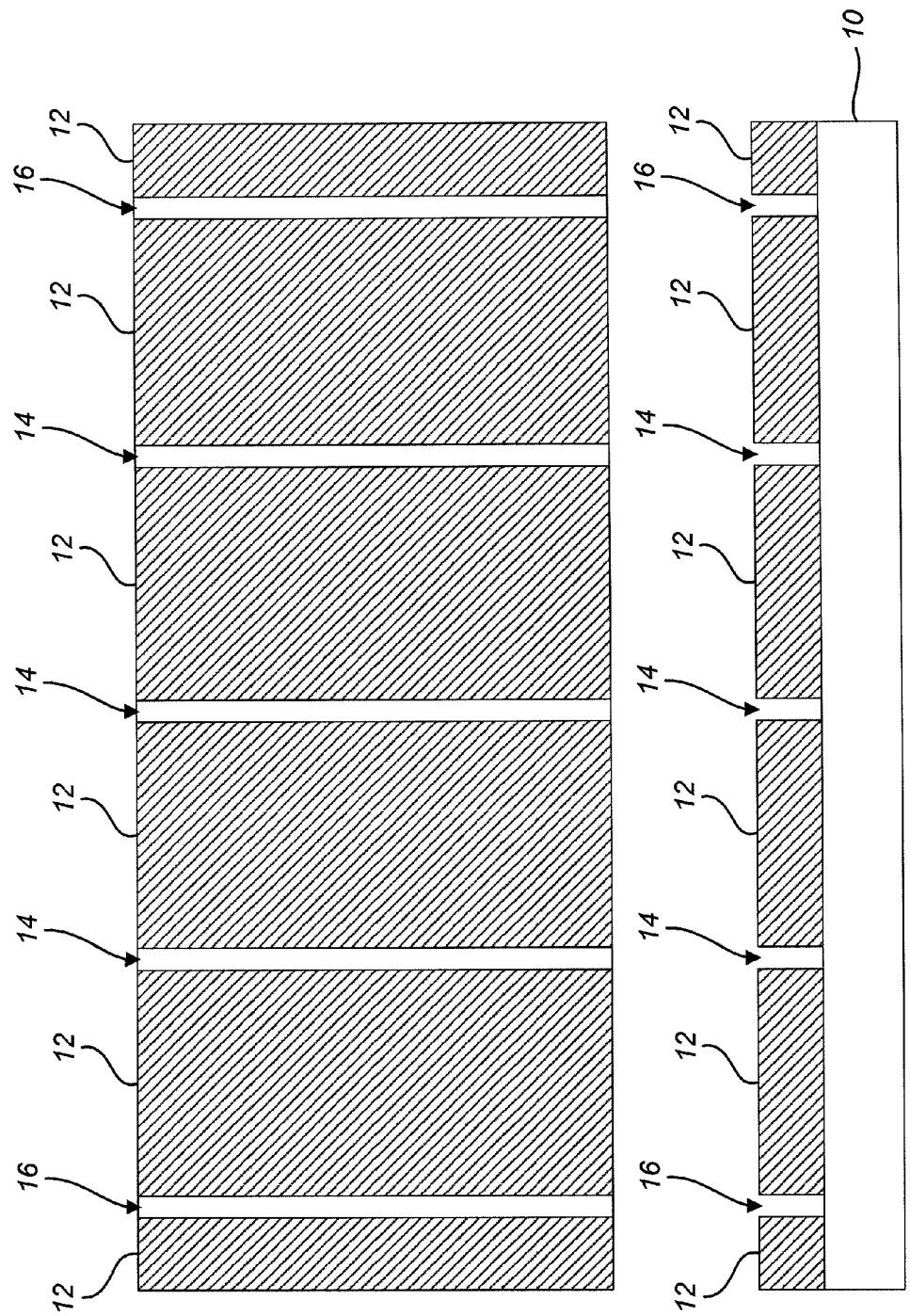
Figure 1C:
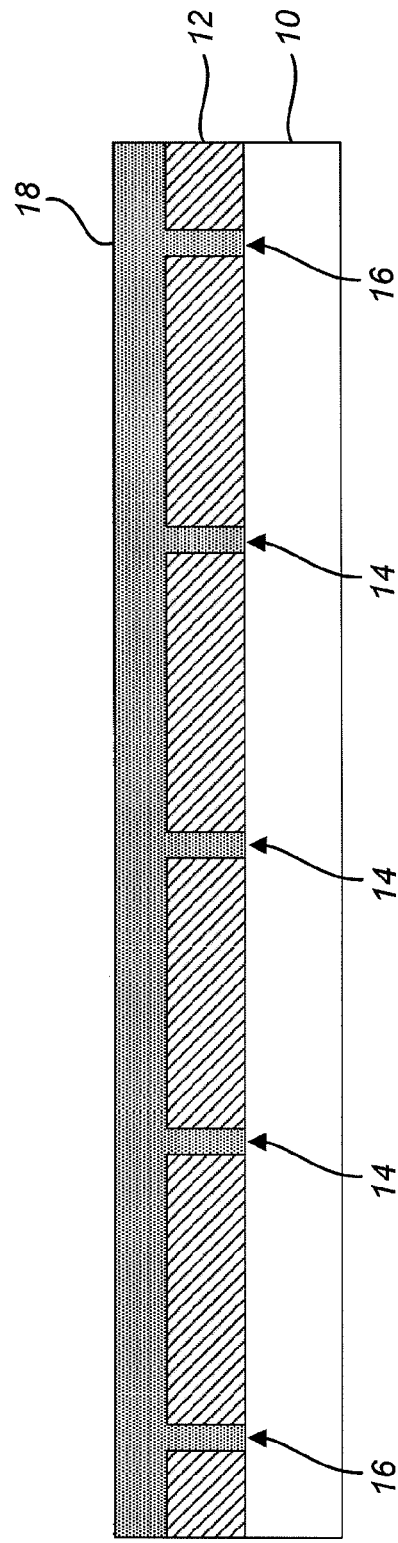
Figure 1D:
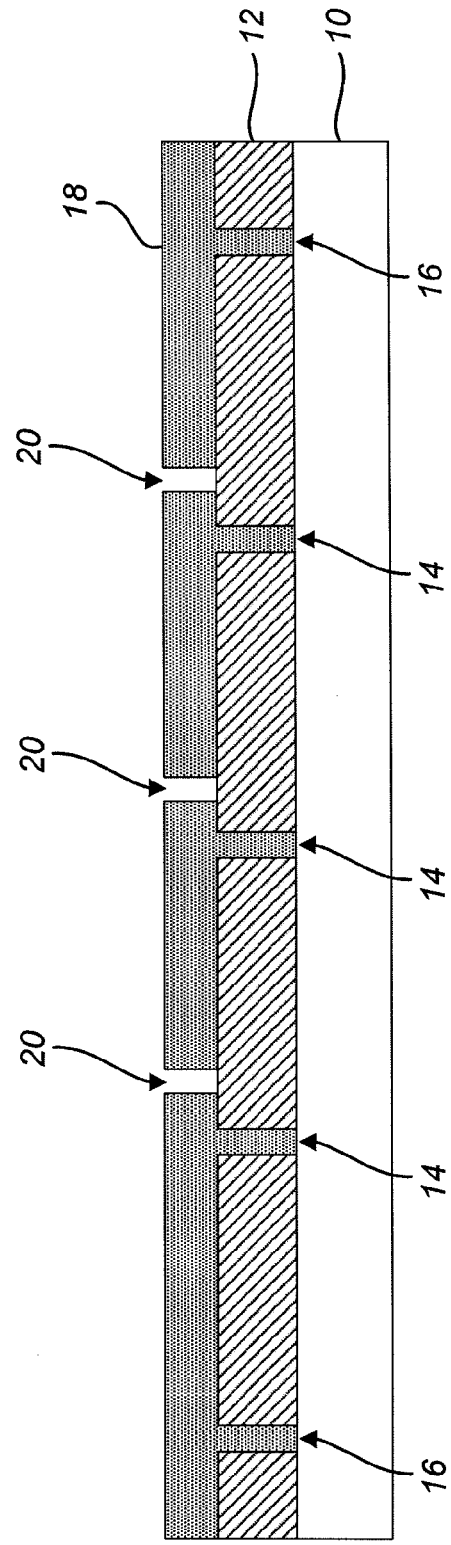
Figure 1E:
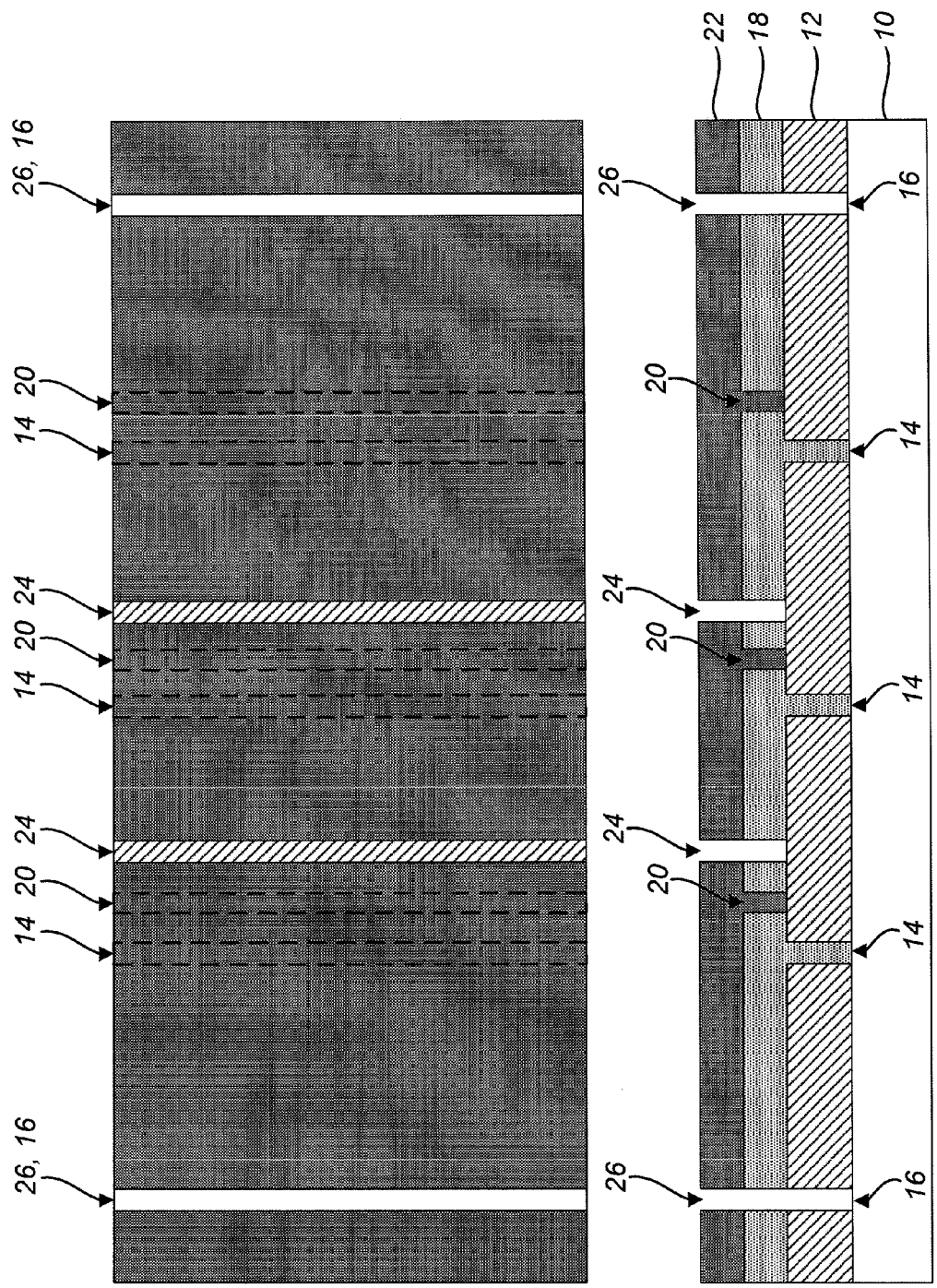
Figure 2:
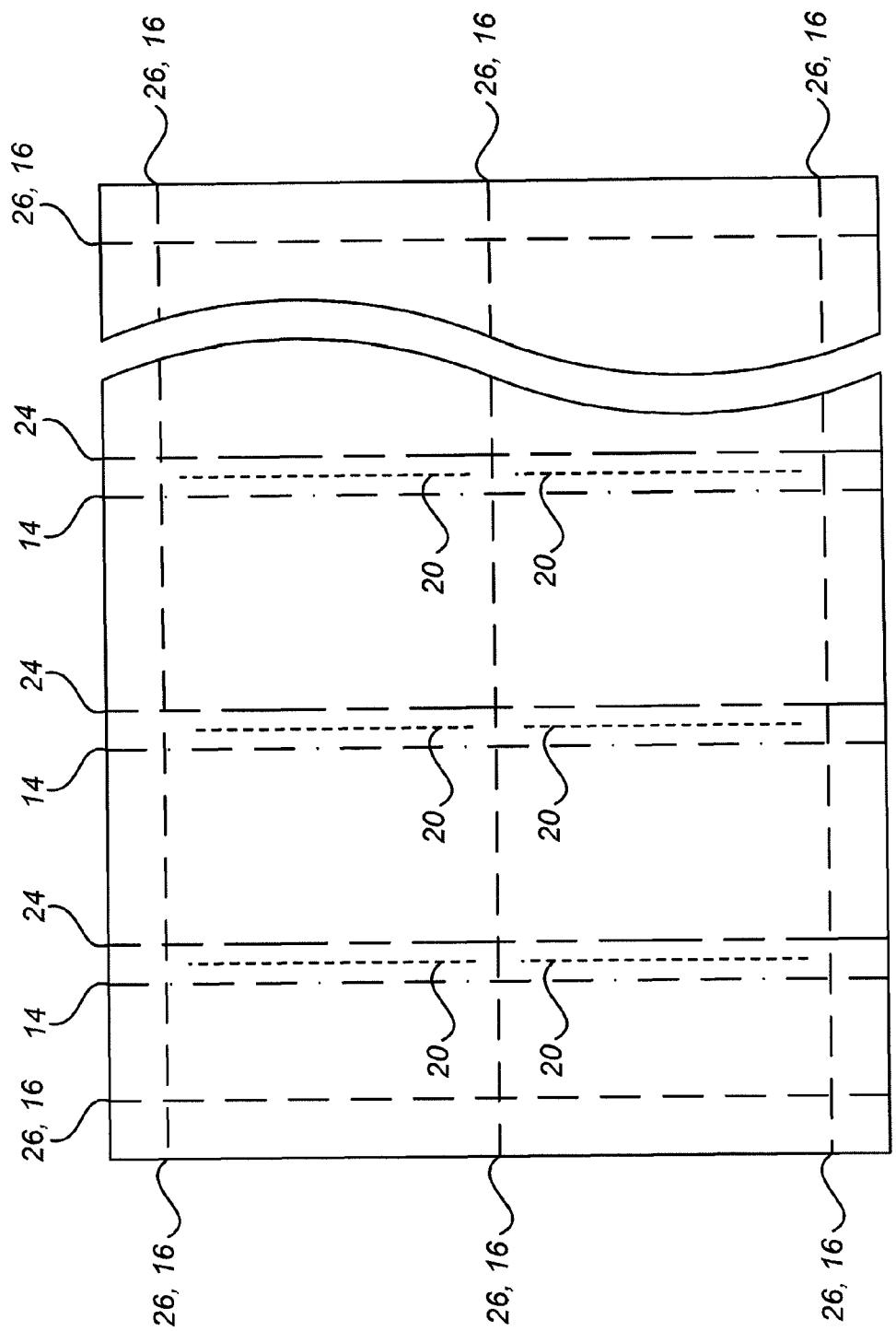

FIG. 2 diagrammatically illustrates a resulting configuration of laser-scribed lines in a solar-cell assembly when fabricated using the above-described existing sequence. As discussed above, the first set of lines scribed during the existing fabrication sequence are the P1 lines 14, 16, which are scribed into the TCO layer 12 (illustrated in FIG. 1B). The silicon layers 18 are then deposited on the TCO layer 12 and within the P1 lines 14, 16 (illustrated in FIG. 1C). The second set of lines scribed are the P2 lines 20, which are scribed into the silicon layers 18 (illustrated in FIG. 1D). For the reasons discussed below, the existing fabrication sequence scribes the P2 lines 20 in separate segments so as to skip over the previously scribed P1 isolation lines 16, which were filled with as part of the deposition of the silicon layers 18. The metal layer 22 is then deposited on top of the silicon layers 18 and within the P2 lines 20 (illustrated in FIG. 1E). The P3 lines 24, 26 are then scribed (resulting configurations illustrated in FIG. 1E). In the existing fabrication process, the P3 interconnect lines 24 may be laser scribed by directing a series of laser pulses from a laser assembly located below the workpiece up through the substrate 10 and the TCO layer 12 so as to cause ablation of both the silicon layers 18 and the adjacent metal layer 24 (see FIG. 1E for resulting configuration of P3 interconnect lines 24). In the existing fabrication process, the P3 isolation lines 26 may be laser scribed by directing a series of laser pulses from a laser assembly located below the workpiece up through the substrate 10 so as to cause ablation of the portion of the silicon layers 18 that filled the P1 isolation lines 16, the portion of the silicon layers 18 overlying the filled P1 isolation lines 16, and the adjacent metal layer 24 (see FIG. 1E for resulting configuration of P3 isolation lines 26).

Figure 3A:
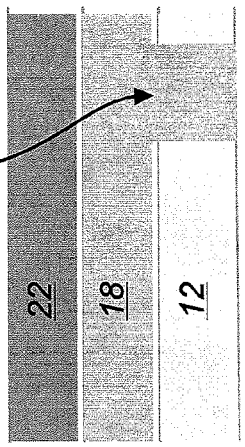
FIGS. 3A and 3B diagrammatically illustrate before and after layer configurations for the formation of a P2 interconnect line, in accordance with many embodiments.
Figure 3B:
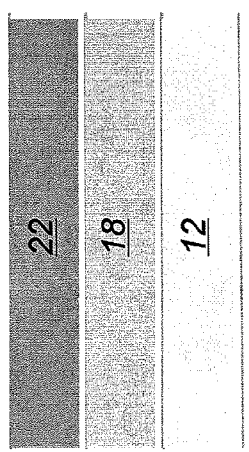
Figure 3C:
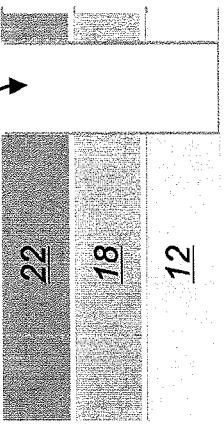
FIG. 3C diagrammatically illustrates a layer configuration at the intersection with a P1 isolation line, which is skipped over during the formation of a P2 interconnect line using the existing sequence of FIGS. 1A through 1E and FIG. 2.
Figure 3D:
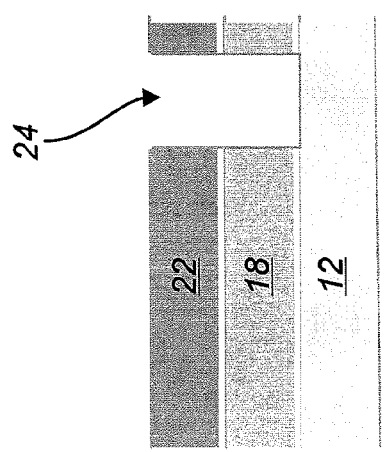
FIG. 3D diagrammatically illustrates a defective P2 interconnect line that may be formed if the layer configuration of FIG. 3C is not skipped over during the formation of a P2 interconnect line using the existing sequence of FIGS. 1A through 1E and FIG. 2.

FIGS. 3A and 3B diagrammatically illustrate before and after layer configurations for the formation of a P2 interconnect line 20, in accordance with many embodiments. FIG. 3A illustrates the layer stack-up in which the P2 interconnect line 20 (illustrated in FIG. 3B) is scribed. The laser pulse parameters used to ablate the P2 interconnect line 20 are selected to cause the ablation of a portion of the silicon layers 18. FIG. 3C diagrammatically illustrates the layer stack-up that exists (in the above-described existing fabrication sequence) at an intersection with a P1 isolation line 16, where a portion of the silicon layers 18 is disposed within the P1 isolation line 16 as a result of the deposition of the silicon layers 18. In the above-described existing process, the P2 interconnect lines 20 are segmented so as to skip over such intersections to avoid forming a P2 interconnect line defective portion 20D (illustrated in FIG. 3D), which would be filled with a portion of the metal layer 22 during the deposition of the metal layer 22, which may complicate the subsequent formation of a P3 isolation line 26 (illustrated in FIG. 5B).

Figure 4A:
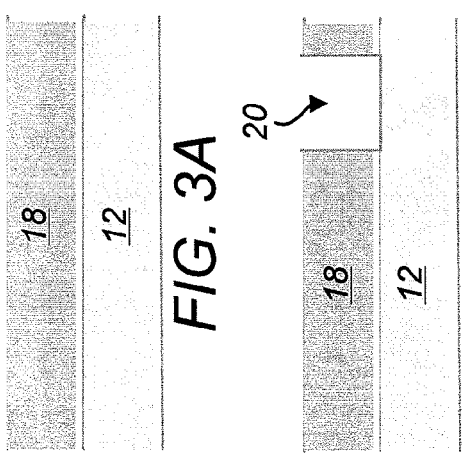
FIGS. 4A and 4B and FIGS. 5A and 5B diagrammatically illustrate before and after layer configurations for the formation of a P3 interconnect line and a P3 isolation line, respectively, for the existing sequence of FIGS. 1A through 1E and FIG. 2.
Figure 4B:
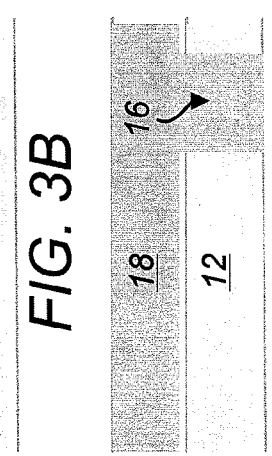
Figure 5A:
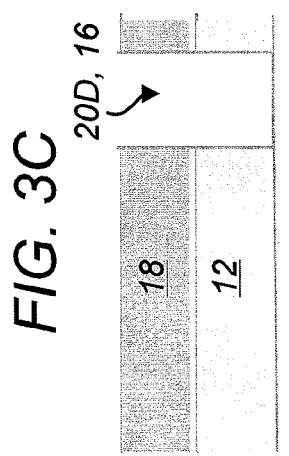
Figure 5B:
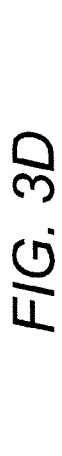

FIGS. 4A and 4B and FIGS. 5A and 5B diagrammatically illustrate before and after layer configurations for the formation of a P3 interconnect line 24 and a P3 isolation line 26, respectively, for the above-described existing fabrication sequence. FIG. 4A illustrates the layer stack-up that is scribed to form the P3 interconnect line 24 illustrated in FIG. 4B. In the existing fabrication process, the P3 interconnect line 24 may be laser scribed as described above. FIG. 5A illustrates the layer stack-up that is scribed to form the P3 isolation line 26 illustrated in FIG. 5B. In the existing fabrication process, the P3 isolation line 26 may be laser scribed as described above.

Figure 6A:
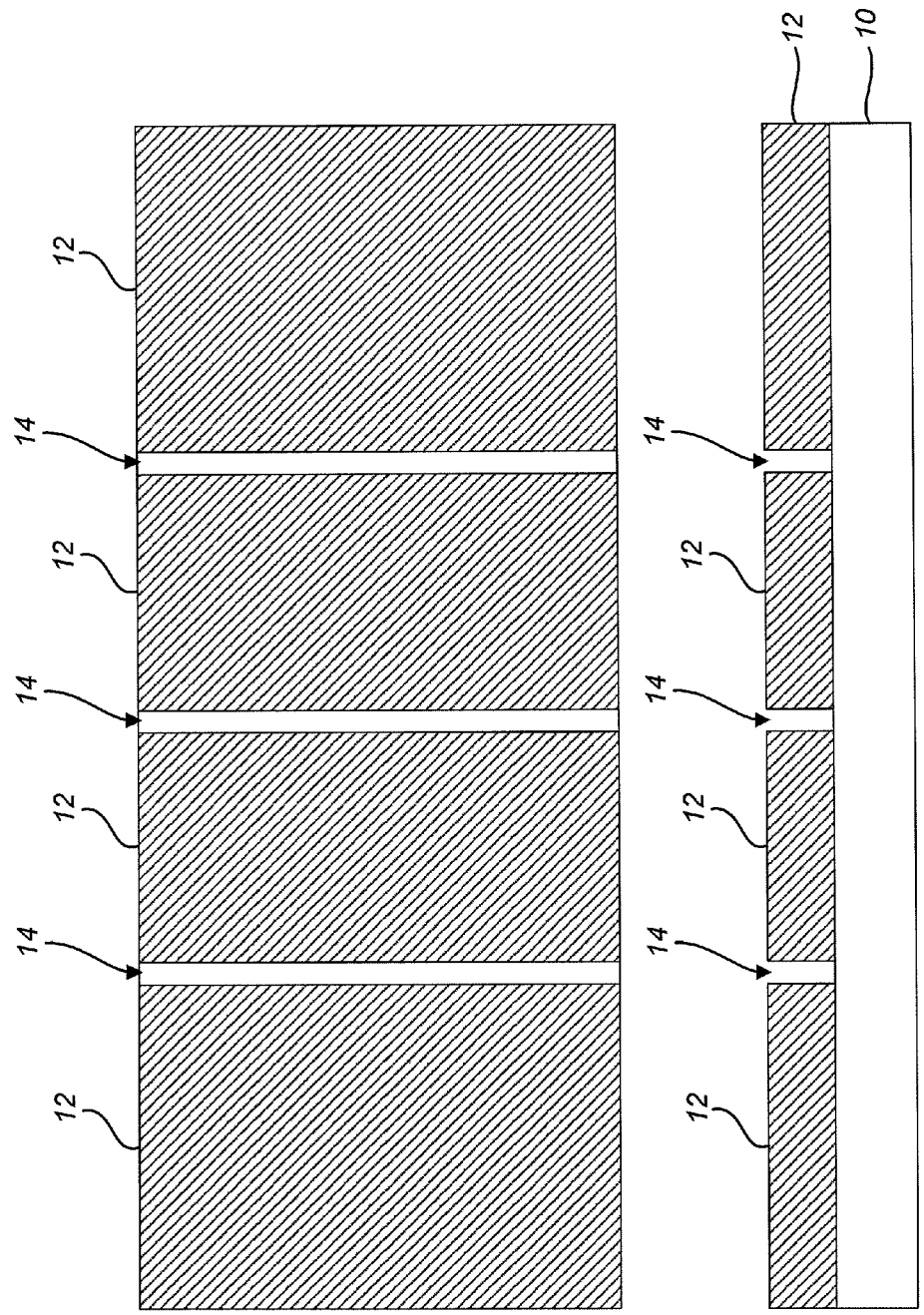
FIGS. 6A through 6D and FIG. 7 diagrammatically illustrate a fabrication sequence, in accordance with many embodiments, for fabricating a solar-cell assembly.
Figure 6B:
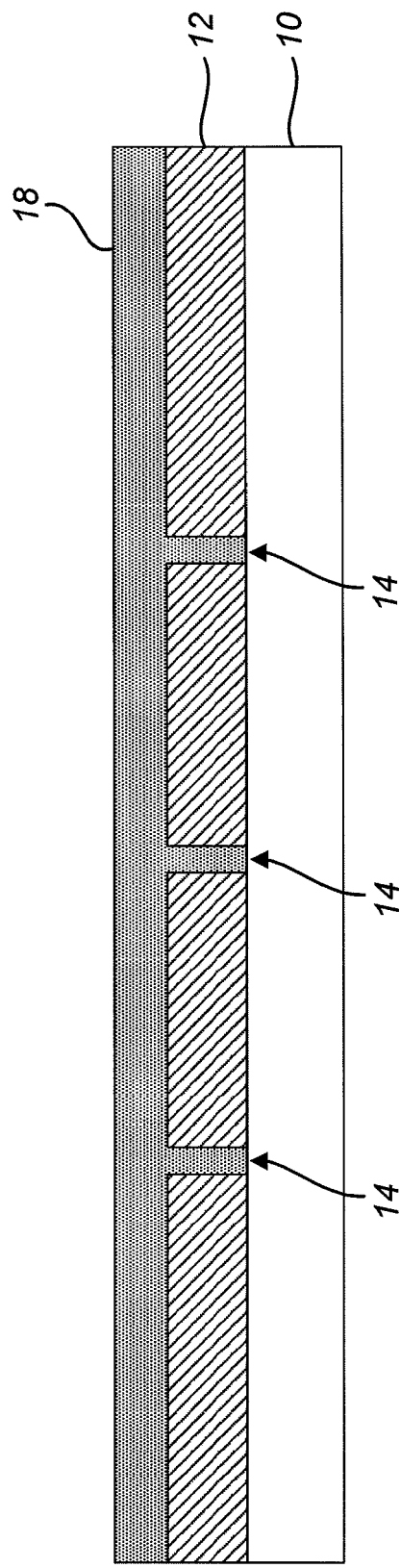
Figure 6C:
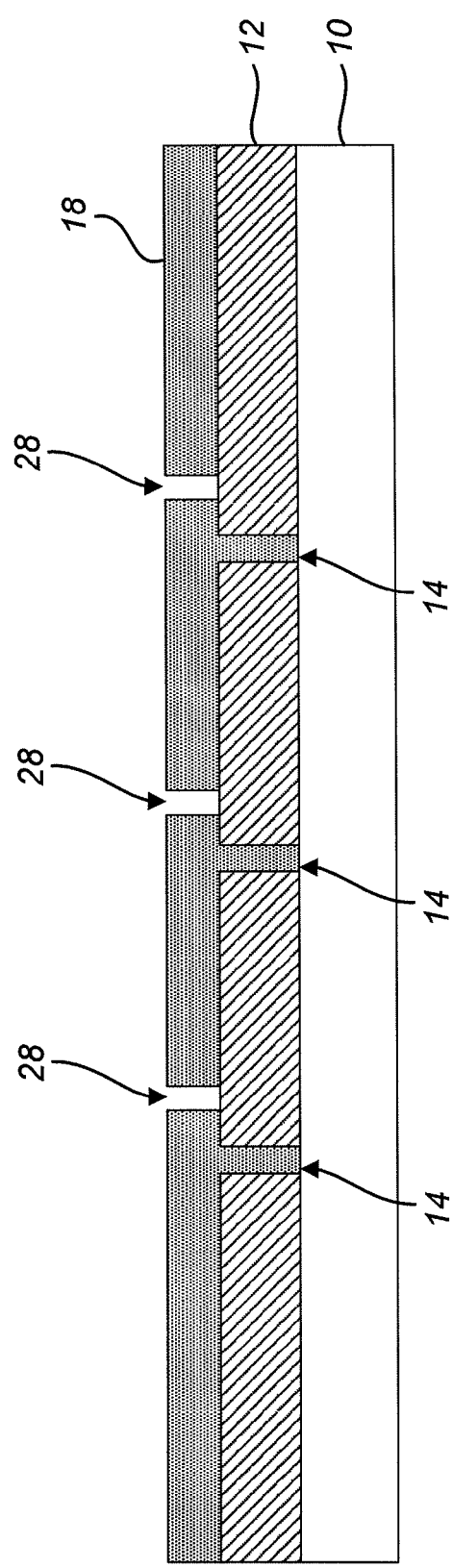
Figure 6D:
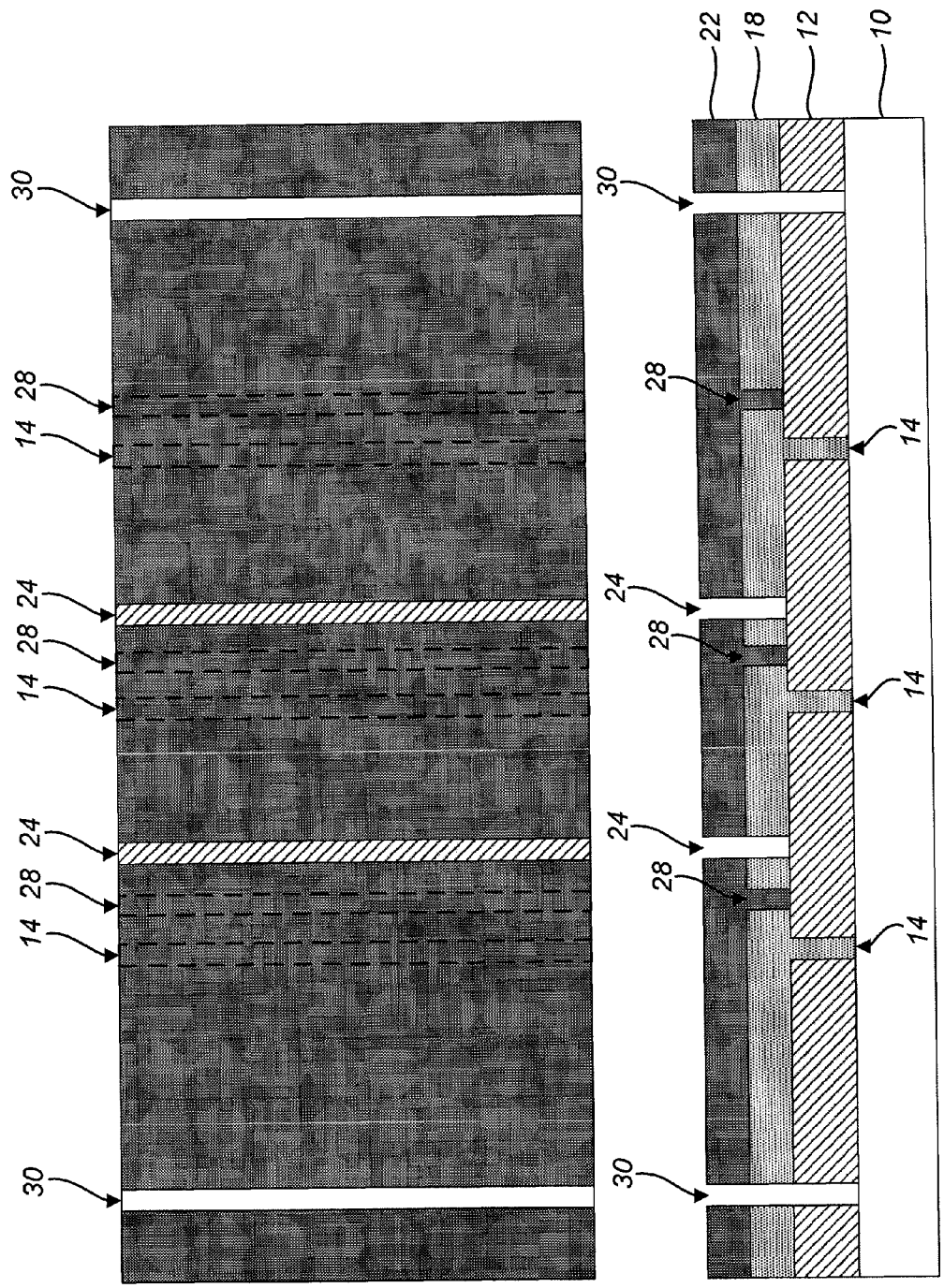

FIGS. 6A through 6D diagrammatically illustrate an improved sequence, in accordance with many embodiments, for fabricating a solar-cell assembly. FIG. 6A illustrates the first revised step in the improved fabrication sequence, where the P1 interconnect lines 14 are scribed in the TCO layer 12 and the P1 isolation lines 16 that were scribed in the above-described existing sequence are omitted. FIG. 6B illustrates the next step in the improved sequence, where the plurality of doped and undoped amorphous silicon (a-Si) layers 18 are deposited on top of the TCO layer 12 and within the scribed P1 interconnect lines 14. FIG. 6C illustrates the next step in the improved sequence, where continuous P2 interconnect lines 28 are scribed in the silicon layers 18. In contrast to the above-described existing process that used segmented P2 interconnect lines 20 (illustrated in FIG. 2), the absence of the P1 isolation lines 16 in the improved process allows the use of continuous interconnect P2 lines 28 (illustrated in FIG. 7). FIG. 6D illustrates the next step in the improved sequence, where the metal layer 22 is deposited on top of the silicon layers 18 and within the continuous P2 lines 28. FIG. 6D also illustrates the next step in the improved sequence, where the P3 interconnect lines 24 and P3 isolation lines 30 are scribed as illustrated. As will be described in more detail below, the scribing of the P3 isolation lines 30 of the improved process differ from the scribing of the P3 isolation lines 26 of the above-described existing process in that the P3 isolation lines 30 of the improved process are scribed in a number of additional layer stack-ups than are the P3 isolation lines 26 of the above-describe existing process.

Figure 7:
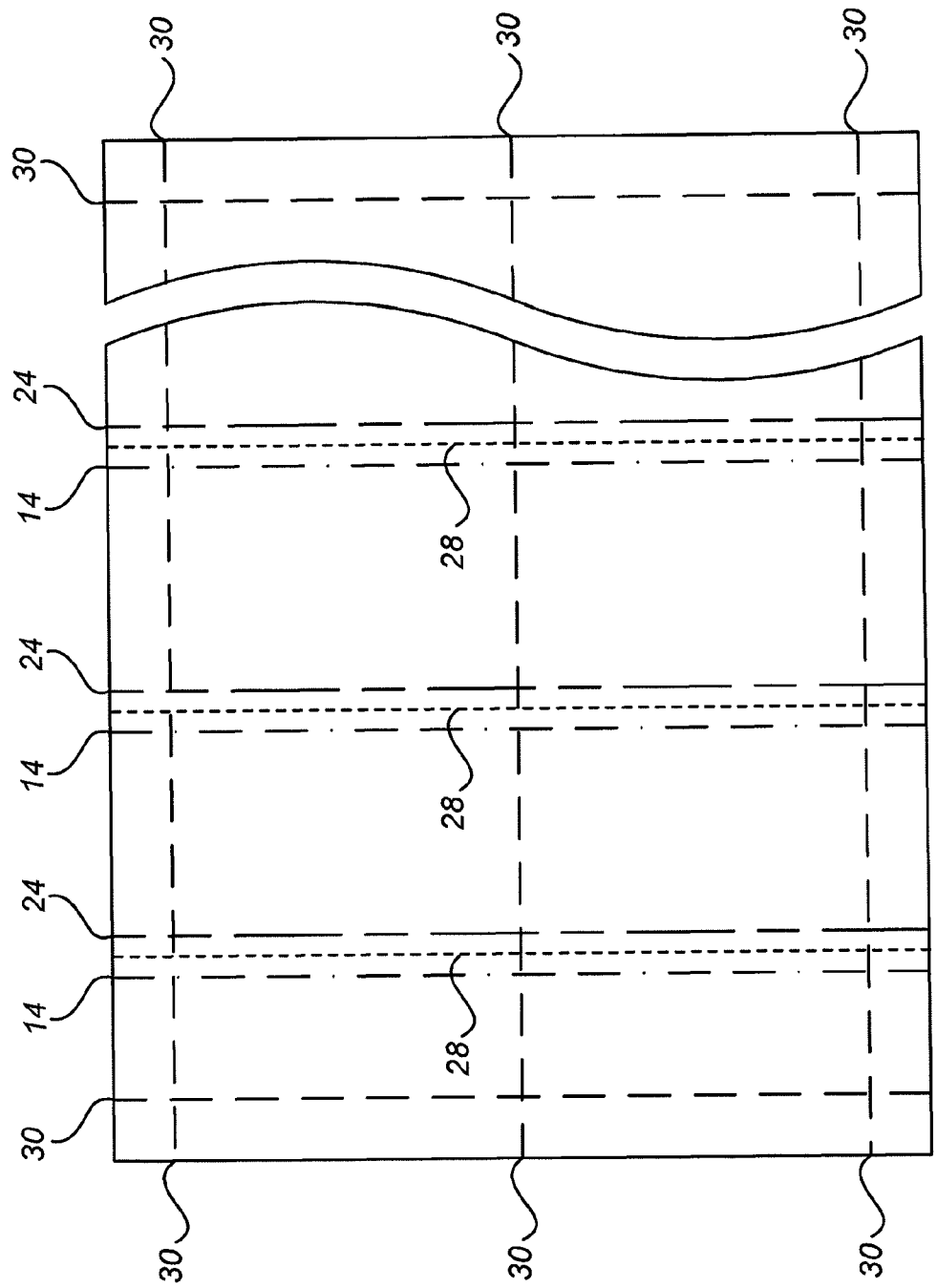

FIG. 7 diagrammatically illustrates a resulting configuration of scribed lines in a solar-cell assembly when fabricated using an improved fabrication sequence, in accordance with many embodiments. As discussed above, the first set of lines scribed during the improved fabrication sequence are the P1 interconnect lines 14, which are scribed into the TCO layer 12 (illustrated in FIG. 6A). As discussed above, the P1 isolation lines 16 that were scribed in the above-described existing process are omitted. The silicon layers 18 are then deposited on the TCO layer 12 and within the P1 interconnect lines 14 (illustrated in FIG. 6B). The second set of lines scribed are the continuous P2 interconnect lines 28, which are scribed into the silicon layers 18 (illustrated in FIG. 6C). The metal layer 22 is then deposited on top of the silicon layers 18 and within the continuous P2 interconnect lines 28 (illustrated in FIG. 6D). The P3 interconnect lines 24 and the P3 isolation lines 30 are then scribed (resulting configurations illustrated in FIG. 6D).

FIGS. 8A through 8D diagrammatically illustrate the various layer configurations in which a P3 isolation line 30 may be formed using the improved fabrication sequence, in accordance with many embodiments. FIG. 8A illustrates the layer stack-up (i.e., not at the intersection of a P1, P2, or P3 interconnect line) in which a P3 isolation line 30 would be formed using the improved fabrication sequence. As opposed to the above-described existing process in which a local portion of the TCO layer 12 was previously scribed (i.e., a P1 isolation line 16 resulting in the layer stack-up the same as illustrated in FIG. 8B), the scribing of a P3 isolation line 30 in the improved process includes, at least for many locations, the scribing of the TCO layer 12. FIG. 8B illustrates the layer stack-up encountered at the intersection of a P1 interconnect line 14, which, as just mentioned, is the same layer stack-up that exists in the existing process where the TCO layer was previously scribed (i.e., the P1 isolation line 16). FIG. 8C illustrates the layer stack-up encountered at the intersection of a continuous P2 interconnect line 28, which is a layer stack-up that would not be encountered in the above-described existing process due to the segmented nature of the P2 interconnect lines 20 used in that process. FIG. 8D illustrates the layer stack-up that would be encountered at the intersection of a P3 interconnect line 24, which in many embodiments would be scribed before the scribing of the P3 isolation lines 30. Alternatively, in many embodiments, one or more P3 isolation lines 30 are scribed prior to one or more P3 interconnect lines 24, in which case the layer stack-up illustrated in FIG. 8D may not be encountered during the scribing of a P3 isolation lines 30. FIG. 8E illustrates, for comparison purposes, a P3 isolation line 30.

FIG. 9 is a table comparing aspects of the above-describe existing fabrication sequence with the improved (new) sequence. As can be seen, in some aspects the existing and the new sequence are similar. For example, both sequences involve the scribing of continuous P1 interconnect lines 14 and continuous P3 interconnect lines 24 through the same layer stack-ups (A P3 interconnect line 24 can be continuously scribed in the above-described existing process because the portion of the silicon layers 18 residing within a P1 isolation line 16 is removed to form a P3 isolation line 26.) However, where the existing sequence includes the scribing of P1 isolation lines 16, the new sequence does not, which allows for the use of continuous P2 interconnect lines 28 in the new sequence as compared to the use of segmented P2 interconnect lines 20 in the existing sequence. Additionally, due to the different layer stack-ups encountered in the new sequence, it is anticipated that laser ablation parameters used during the formation of the P3 isolation lines 30 in the new sequence may need to be substantially different from laser ablation parameters used in the formation of the P3 isolation lines 26 in the existing sequence. It is anticipated that many embodiments will use a laser wavelength that is near infrared (at about 1 micron) or second harmonic wavelength at approximately 0.53 micron. In many embodiments, a sequential ablation approach is used to sequentially ablate layers (in one or more layer stack-ups) so as to achieve the desired line configuration.

Laser-Scribing Devices

Figure 10:
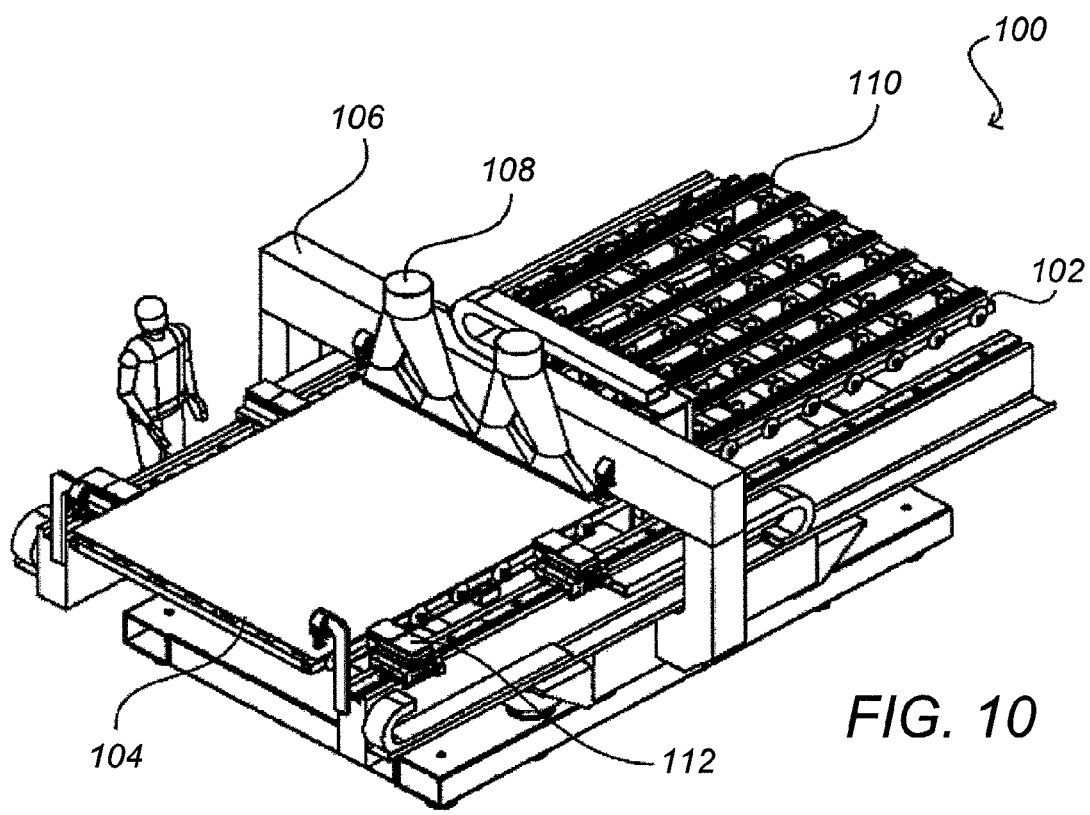
FIG. 10 illustrates a perspective view of a laser-scribing device that can be used in accordance with many embodiments.

FIG. 10 illustrates a laser-scribing device 100 that can be used in accordance with many embodiments. The laser-scribing device 100 includes a substantially planar bed or stage 102, which may be level, for receiving and maneuvering a workpiece 104, such as a substrate having at least one layer deposited thereon. In many embodiments, the workpiece is able to move back and forth along a single directional vector at a rate of up to or greater than 2 m/s. In many embodiments, the workpiece will be aligned to a fixed orientation with the long axis of the workpiece substantially parallel to the motion of the workpiece in the laser-scribing device 100. The alignment can be aided by the use of an imaging device (e.g., a camera) that acquire marks on the workpiece. In the laser-scribing device 100, the lasers (shown in subsequent figures) are positioned beneath the workpiece and opposite a bridge 106 holding part of an exhaust mechanism 108 for extracting material ablated or otherwise removed from the substrate during the scribing process. The workpiece 104 can be loaded onto a first end of the stage 102 with the substrate side down (towards the lasers) and the layered side up (towards the exhaust). The workpiece can be received onto an array of rollers 110, although other bearing- or translation-type objects can be used to receive and translate the workpiece as known in the art. In the laser-scribing device 100, the array of rollers 110 all point in a single direction, along the direction of propagation of the workpiece, such that the workpiece can be moved back and forth in a longitudinal direction relative to the laser assembly. The device can include at least one controllable drive mechanism 112 for controlling a direction and translation velocity of the workpiece 104 on the stage 102. Further description about such a system and its use is provided in U.S. Pub. No. 2009/0321399 A1, which is incorporated by reference above.

Figure 11:
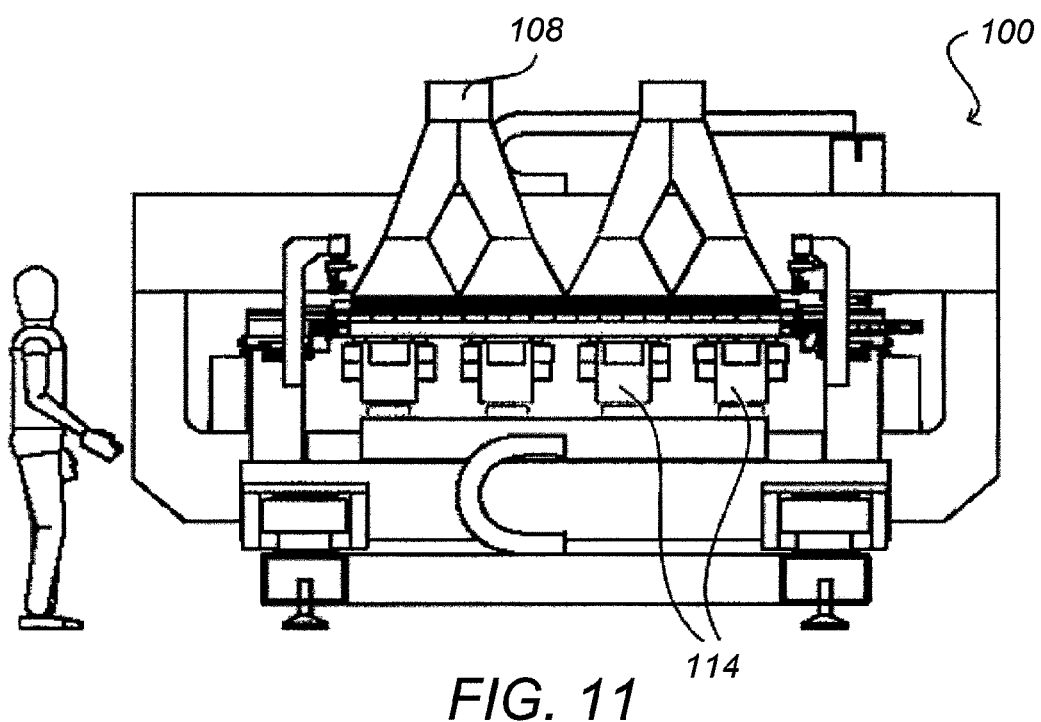
FIG. 11 illustrates an end view of a laser-scribing device that can be used in accordance with many embodiments.

FIG. 11 illustrates an end view of the laser-scribing device 100, illustrating a series of laser assemblies 114 used to scribe the layers of the workpiece. In the laser-scribing device 100, there are four laser assemblies 114 each including a laser and elements, such as lenses and other optical elements, used to focus or otherwise adjust aspects of the laser. The laser can be any appropriate laser operable to ablate or otherwise scribe at least one layer of the workpiece, such as a pulsed solid-state laser. As can be seen, a portion of the exhaust 108 is positioned opposite each laser assembly relative to the workpiece, in order to effectively exhaust material that is ablated or otherwise removed from the workpiece via the respective laser assembly. Each laser assembly actually produces two effective beams useful for scribing the workpiece. In order to provide the pair of beams, each laser assembly can include at least one beam splitting device.

Figure 12:
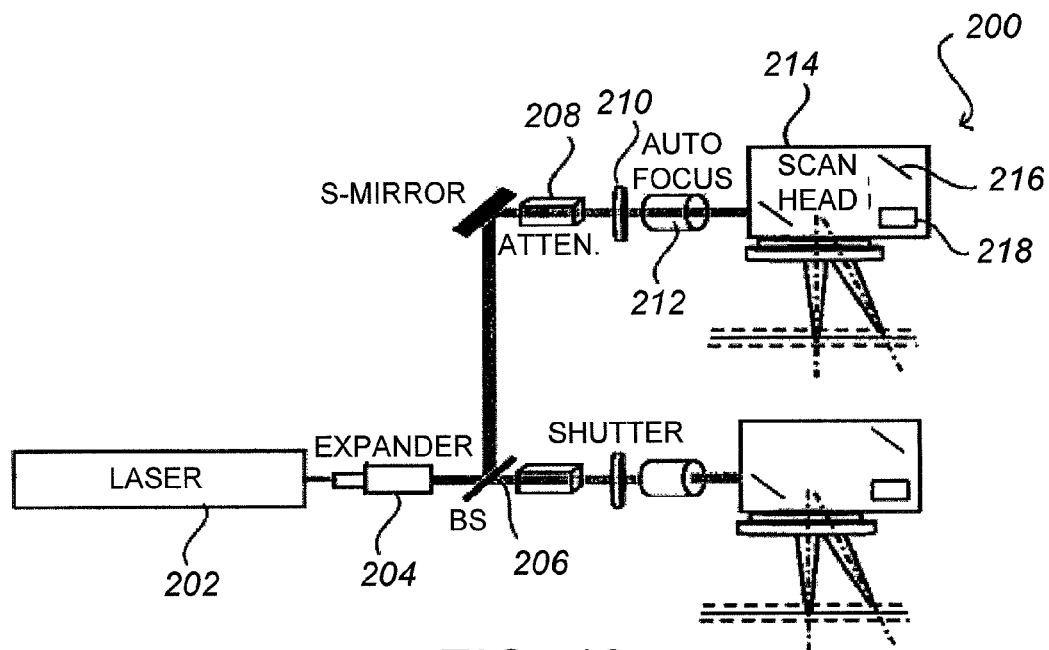
FIG. 12 illustrates components of a laser assembly that can be used in accordance with many embodiments.

FIG. 12 illustrates basic elements of a laser assembly 200 that can be used in accordance with many embodiments, although it should be understood that additional or other elements can be used as appropriate. In the laser assembly 200, a single laser 202 generates a beam that is expanded using a beam expander 204 then passed to a beam splitter 206, such as a partially transmissive mirror, half-silvered mirror, prism assembly, etc., to form first and second beam portions. In the laser assembly 200, each beam portion passes through an attenuating element 208 to attenuate the beam portion, adjusting an intensity or strength of the pulses in that portion, and a shutter 210 to control the shape of each pulse of the beam portion. Each beam portion then also passes through an auto-focusing element 212 to focus the beam portion onto a scan head 214. Each scan head 214 includes at least one element capable of adjusting a position of the beam, such as a galvanometer scanner useful as a directional deflection mechanism. In many embodiments, this is a rotatable mirror able to adjust the position of the beam along a latitudinal direction, orthogonal to the movement vector of the workpiece 104, which can allow for adjustment in the position of the beam relative to the intended scribe position.

Figure 13:
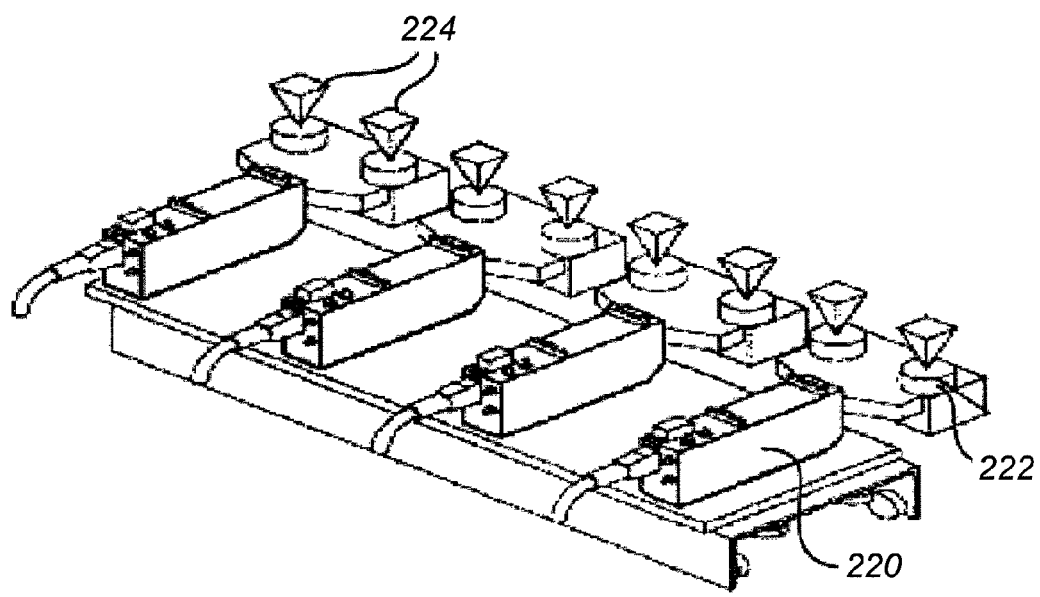
FIG. 13 illustrates the generation of multiple scan areas that can be used in accordance with many embodiments.

In many embodiments, each scan head 214 includes a pair of rotatable mirrors 216, or at least one element capable of adjusting a position of the laser beam in two dimensions (2D). Each scan head can include at least one drive element 218 operable to receive a control signal to adjust a position of the "spot" of the beam within a scan field and relative to the workpiece. In many embodiments, a spot size on the workpiece is on the order of tens of microns within a scan field of approximately 60 mm×60 mm, although various other dimensions are possible. While such an approach allows for improved correction of beam positions on the workpiece, it can also allow for the creation of patterns or other non-linear scribe features on the workpiece. Further, the ability to scan the beam in two dimensions means that any pattern can be formed on the workpiece via scribing without having to rotate the workpiece. For example, FIG. 13 illustrates a perspective view of example laser assemblies in accordance with many embodiments. A pulsed beam from each laser 220 is split along two paths, each being directed to a 2D scan head 222. As shown, the use of a 2D scan head 222 results in a substantially square scan field for each beam, represented by a pyramid 224 exiting each scan head 222. By controlling a size and position of the square scan fields relative to the workpiece, the lasers 220 are able to effectively scribe any location on the substrate while making a minimal number of passes over the substrate. If the positions of the scan fields substantially meet or overlap, the entire surface could be scribed in a single pass of the substrate relative to the laser assemblies.

Figure 14:
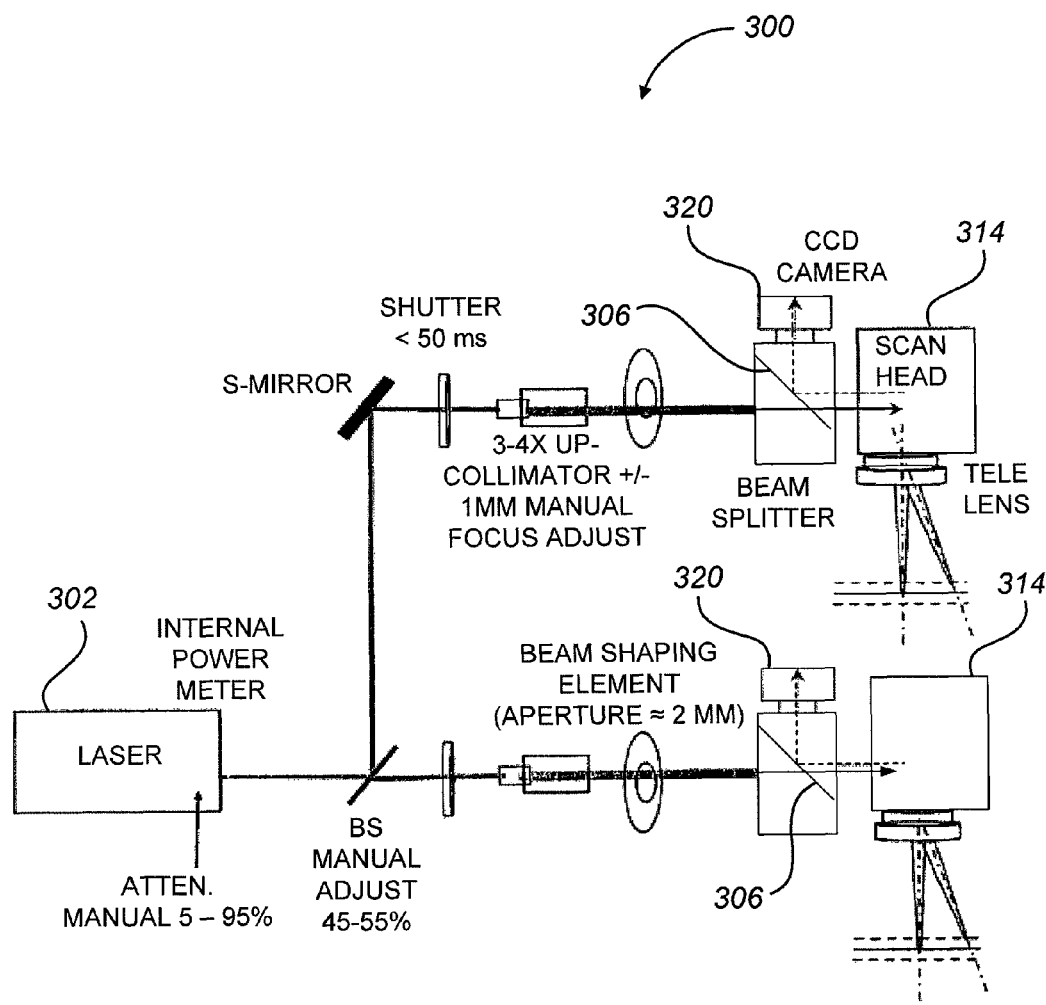
FIG. 14 diagrammatically illustrates the integration of an imaging device with a laser-scanning assembly, in accordance with many embodiments.

FIG. 14 diagrammatically illustrates a laser assembly 300 in accordance with many embodiments. The laser assembly 300 is similar to the previously discussed laser assembly 200 of FIG. 12, but further includes two imaging devices 320 (e.g., CCD cameras shown) integrated with the laser assembly 300 so that each of the imaging devices 320 can view the workpiece through an associated scanner 314. As shown, each of the imaging devices 320 can be integrated using a dichromatic beam splitter 306 so as to provide the imaging device with a view direction that substantially corresponds with the direction along which a separate laser beam portion is provided to each of the scanners 314. As discussed above, although a range of relative positions can be practiced, an imaging device 320 can be integrated with the laser assembly 300 so that the center of its view and the output of the scribing laser 302 point at the same position on the workpiece being targeted by the scanner 314.

Figure 15:
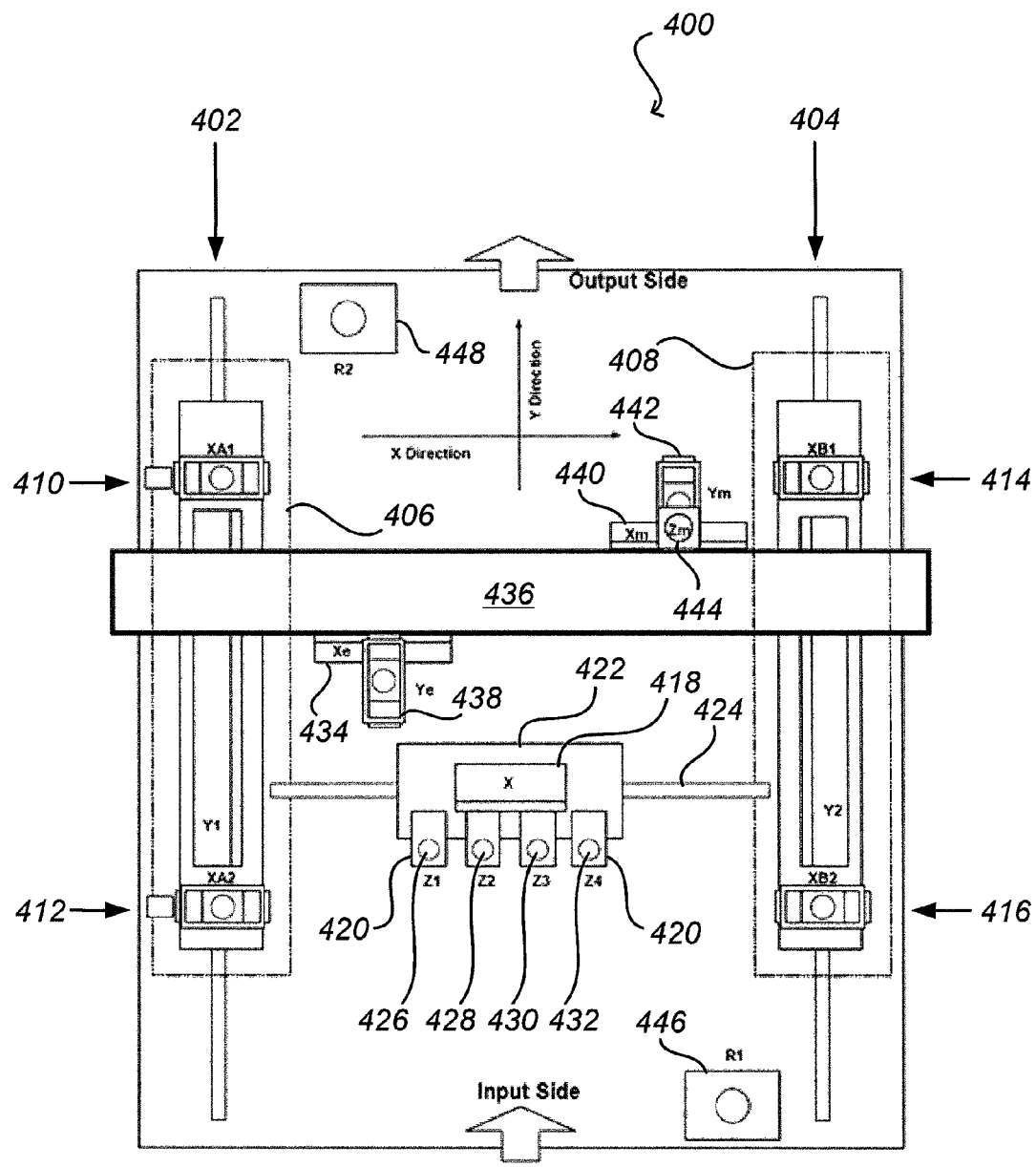
FIG. 15 illustrates stages that can be used to move a workpiece and scribing system components, in accordance with many embodiments.

In accordance with many embodiments, FIG. 15 diagrammatically illustrates a system 400 that includes various stages that can be used to move scribing device components. As will be described in more detail below, the various stages provide for movement of a workpiece, laser-scribing assemblies, an exhaust assembly and a microscope.

Stages Y1 402, Y2 404 can be used to provide for Y-direction movement of a workpiece during laser scribing. The stages Y1 and Y2 each can include a linear motor and one or more air bearings for y-direction travel along Y-stage supports 406, 408. Each linear motor can include a magnetic channel and coils that ride within the magnetic channel. For example, the magnetic channel can be integrated into the Y-stage supports 406, 408, which are preferably precisely manufactured so as to be within predetermined straightness requirements. The supports 406, 408 can be made from a suitable material, for example, granite. The stages Y1 and Y2 are the main Y-direction controls for the movement of the workpiece. There is no mechanical connection between the Y1 and Y2 stages when no workpiece is loaded. When a workpiece is loaded, the Y1 stage can be the master and the Y2 stage can be the follower.

Each of the stages Y1, Y2 can include a position-sensing system, for example, an encoder strip and a read head. An encoder strip can be mounted to each of supports 406, 408, and read heads can be mounted to moving portions of the stages Y1 and Y2, for example, a moving carriage for the Y1 and a moving carriage for the Y2. Output from the read heads can be processed for controlling the position, speed, and/or acceleration of each of the Y-stages. An example read head is a Renishaw Signum RELM Linear encoder readhead SR0xxA, which can be coupled with Interface unit Si-NN-0040. The SR0xxA is a high resolution analog encoder read head. The Interface unit Si-NN-0040 buffers analog encoder signals and generates 0.5 um digital encoder signals. The read head and interface unit are available from Renishaw Inc., 5277 Trillium Blvd., Hoffman Estates, Ill. 60192.

Stages XA1 410 and XA2 412 are mounted for movement with the stage Y1 and provide for finely tuned X-direction control for the workpiece as it is being translated in the Y-direction by the Y stages. Such X-direction control can be used to compensate for straightness deviations of support 406. An external laser measurement system (with straightness and yaw optics/interferometer) can be used during initial calibration to measure straightness and yaw data for the master stage (Y1 stage). The measured data can be used to create error tables, which can be used to supply correction data into a motion controller for use during the Y-direction movement of the workpiece. The XA1, XA2 stages are coupled with the Y1 stage. The stages XA1, XA2 can each include a ball screw stage and be mounted on the Y1 stage with dual-loop control (e.g., rotary and linear encoders) for high accuracy and repeatability. The stages XA1, XA2 can each carry a workpiece gripper module. Each gripper module can include one or more sensors for detecting a position of the gripper module (e.g., open, closed). Each gripper module can also include one or more banking pins for controlling the amount of the workpiece held by the gripper module.

Stages XB1 414, XB2 416 are mounted for movement with the stage Y2. The stages XB1, XB2 can each include a workpiece gripper module, such as the above described gripper module. The stages XB1, XB2 can include a linear stage that can be controlled with an open-loop control system so as to maintain a desired level of tension across a workpiece.

An X laser stage 418 can be used to provide for X-direction movement of laser assemblies 420 during laser scribing of a workpiece. The X laser stage can include a linear motor and one or more air bearings for travel of a laser assembly support 422 along a support rail 424. The laser assembly support 422 can be precision fabricated from a suitable material, for example, granite. The linear motor can include a magnetic channel integrated with the support rail and coils that ride within the magnetic channel.

Z-direction stages Z1 426, Z2 428, Z3 430, and Z4 432 can be used to adjust the vertical positions of the laser assemblies. Such position adjustment can be used for a variety of purposes, for example, to focus the output of a laser assembly on a particular layer of the workpiece.

An Xe exhaust stage 434 can be used to provide for X-direction movement of an exhaust assembly during laser scribing of a workpiece. The Xe exhaust stage can include a linear stage mounted to a side (e.g., front side as shown) of a bridge 436. The bridge can be fabricated from a suitable material, for example, granite. A Ye exhaust stage 438 can be used to provide for Y-direction movement of the exhaust assembly. Such Y-direction movement can be used to move the exhaust assembly away from a laser-scribing area so as to allow inspection of the laser-scribing area with a microscope. The Ye exhaust stage can include a linear actuator, for example, a ball screw actuator.

An Xm microscope stage 440 can be used to provide for X-direction movement of a microscope. The Xm stage can include a linear stage and can be mounted to a side of the bridge 436, for example, the back side as shown. A Ym microscope stage 442 can include a linear stage and be mounted to the Xm stage. A Zm microscope stage 444 can include a linear stage and be mounted to the Ym stage. The combination of the Xm, Ym, and Zm stages can be used to reposition the microscope to view selected regions of a workpiece.

Roller stages R1 446 and R2 448 can be used to load and unload a workpiece, respectively. The R1, R2 roller stages can be configured to be raised relative to an air bearing bed (not shown) during the loading and unloading sequences. For example, the roller stage R1 446 can be in a raised position while a workpiece is being loaded. The roller stage R1 can then be lowered to place the workpiece on the air bearing bed. The workpiece can then be grasped by the gripper modules of stages XA1, XA2, XB1, and XB2. During unloading the sequence can be reversed, such that the workpiece is released from the gripper modules and the roller stage R2 448 can then be raised to lift the workpiece from the air bearing bed.

Figure 16:
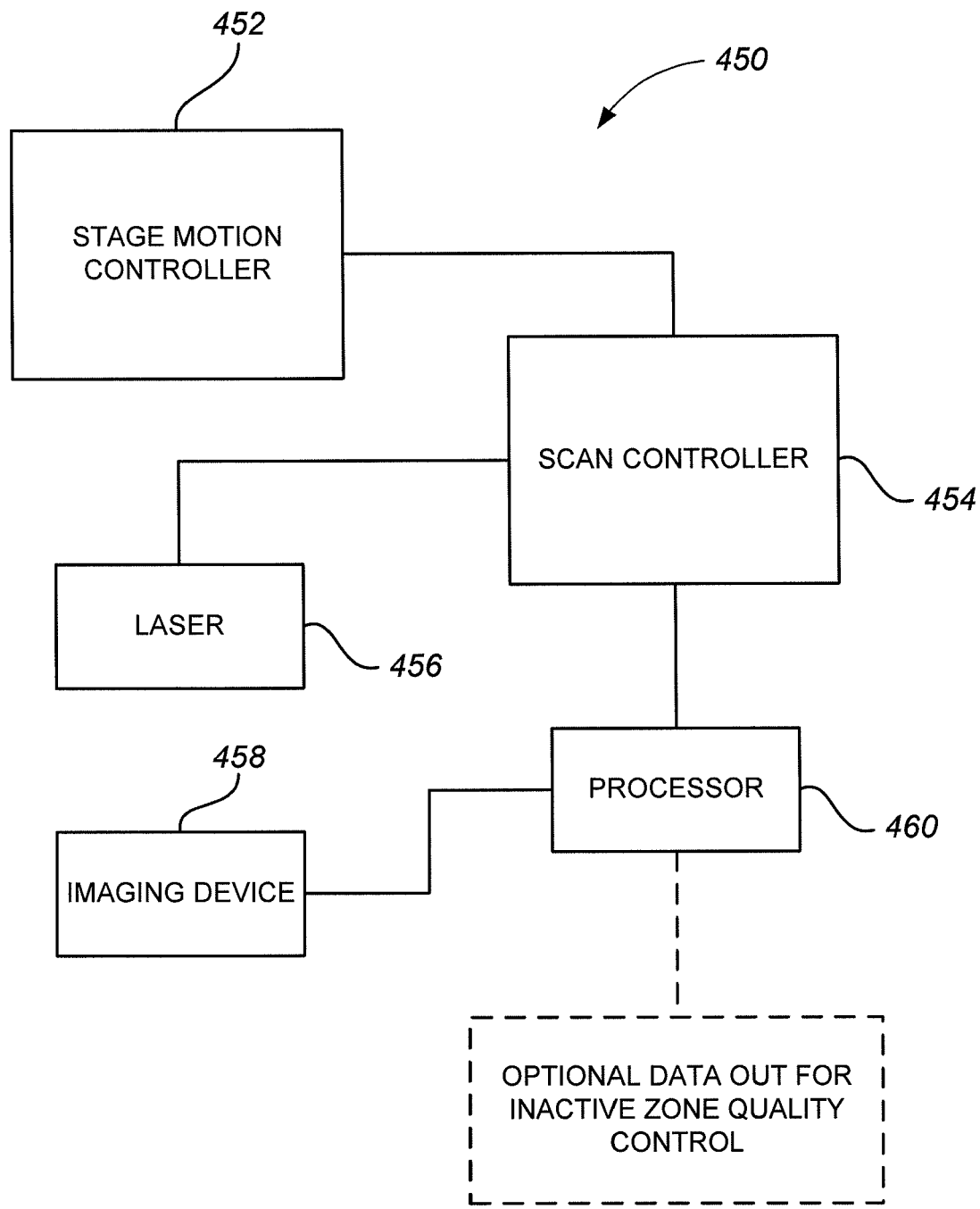
FIG. 16 diagrammatically illustrates signals between components of a laser-scribing system, in accordance with many embodiments.

FIG. 16 diagrammatically illustrates signals between components of a scribing system 450, in accordance with many embodiments. A stage motion controller 452 can be used to move a workpiece relative to a scan head. Alternatively, the scan head can be moved relative to the workpiece or a combination of movement of the workpiece and the scan head can be used. The stage motion controller 452 can transfer its positional information to a scan controller 454, including start and stop signals. The scan controller 454 can send fire control signals to a laser 456, including first pulse suppression and off signals. As describe above, an imaging device 458 can supply image-derived data regarding the positions of features on the workpiece to a processor 460. The processor 460 can generate a correction signal that can be supplied to the scan controller 454 for the correction of subsequently commanded scan locations of a scan head used to target the output from the laser 456 on the workpiece. At the beginning of the formation of a scribe line relative to a previously-formed scribed line, excess space can be allowed. As the formation of the scribe line progresses, the control system can rapidly close in on a desired line spacing. The system can operate to track lines and maximize active area by keeping P1 close to P2 and P3 close to P2.

Figure 17:
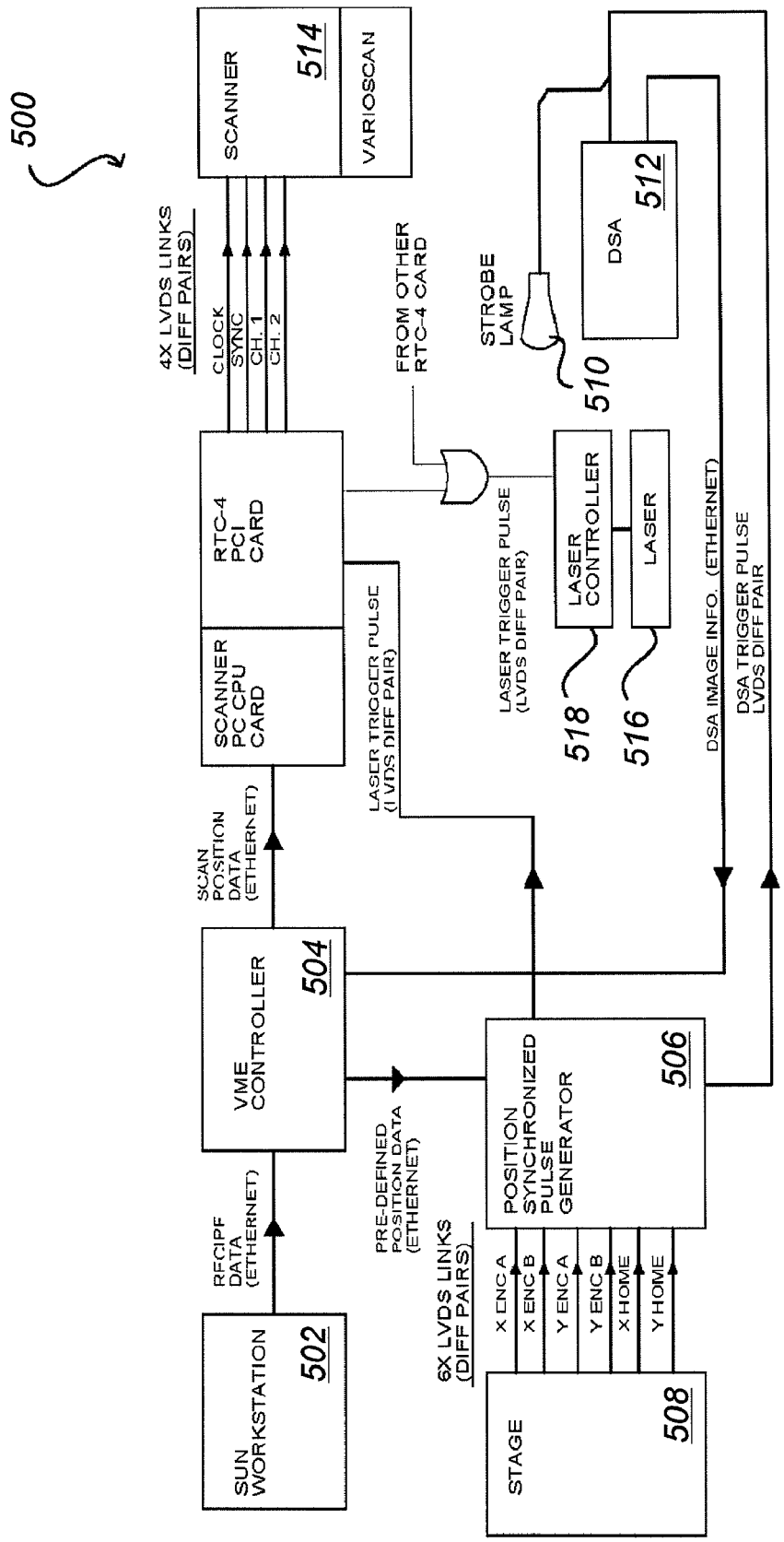
FIG. 17 illustrates a control diagram for a laser-scribing device, in accordance with many embodiments.
Figure 18:
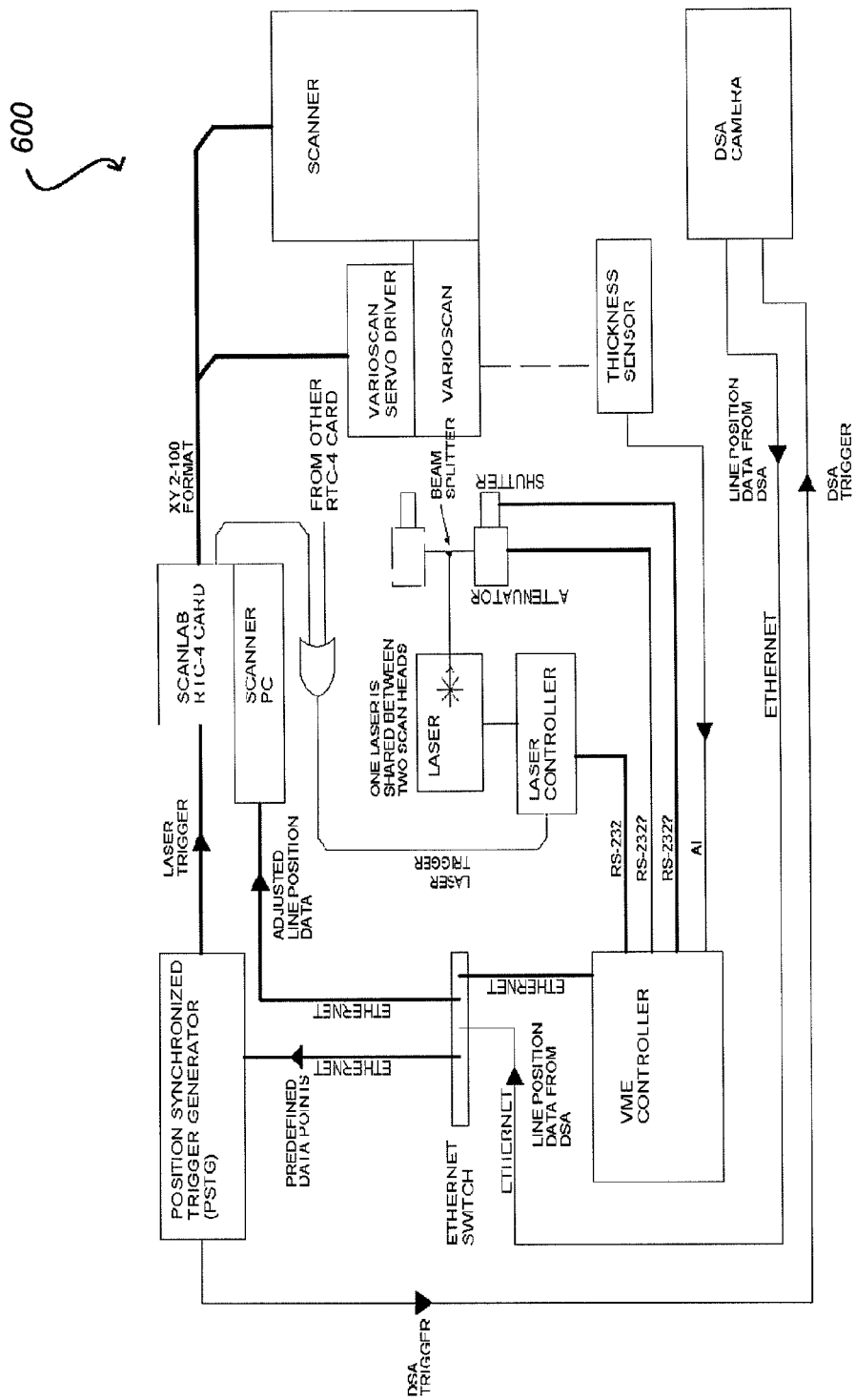
FIG. 18 illustrates a data-flow diagram for a laser-scribing device, in accordance with many embodiments.

FIG. 17 illustrates a control design 500 that can be used for a laser-scribe device in accordance with many embodiments, although many variations and different elements can be used as would be apparent to one of ordinary skill in the art in light of the teachings and suggestions contained herein. In this design, a workstation 502 works through a Virtual Machine Environment (VME) controller 504, such as by using an Ethernet connection, to work with a pulse generator 506 (or other such device) for driving a workpiece translation stage 508 and controlling a strobe lamp 510 and an imaging device 512 for generating images of the scribe position(s). The workstation also works through the VME controller 504 to drive the position of each scanner 514, or scan head, to control the spot position of each beam portion on a workpiece. The workstation further controls the firing of a laser 516 via a laser controller 518. FIG. 18 illustrates a flow of data 600 through these various components.

In many embodiments, scribe placement accuracy is guaranteed by synchronizing the workpiece translation stage encoder pulses to the laser and spot placement triggers. The system can ensure that the workpiece is in the proper position, and the scanners directing the beam portions accordingly, before the appropriate laser pulses are generated. Synchronization of all these triggers is simplified by using the single VME controller to drive all these triggers from a common source. Various alignment procedures can be followed for ensuring alignment of the scribes in the resultant workpiece after scribing. Once aligned, the system can scribe any appropriate patterns on a workpiece, including fiducial marks and bar codes in addition to cell delineation lines and trim lines.

In many embodiments, encoder synchronized triggering of the laser can be used to interrupt the formation of a laser-scribed line so as to skip over a previously-scribed line. For example, during the formation of the P2 lines 20 (discussed above with reference to FIGS. 1D and 2), at least one of an encoder measured position for the workpiece translation stage, an encoder measured position for the X laser stage 418 (discussed above with reference to FIGS. 15, 17, and 18), or a scanning position of a scan head 314 (discussed above with reference to FIG. 14) can be used to coordinate the triggering of the laser so as to skip over the previously-scribed P1 isolation lines 16 (discussed above with reference to FIGS. 1D and 2).

It is understood that the examples and embodiments described herein are for illustrative purposes and that various modifications or changes in light thereof will be suggested to persons skilled in the art and are to be included within the spirit and purview of this application and the scope of the appended claims. Numerous different combinations are possible, and such combinations are considered to be part of the present invention.

What is claimed is:

1. A system for fabricating a solar-cell assembly, the system comprising:
    a support mechanism for receiving a workpiece comprising a substrate and a first layer;
    at least one laser device each configured to direct a laser beam toward the workpiece; and
    a laser controller operable to cause the at least one laser device to:
        scribe a plurality of first interconnect lines into the first layer,
        after a second layer is deposited onto the first layer and into the first interconnect lines, scribe a plurality of second interconnect lines into the second layer, wherein each of the second interconnect lines is located adjacent to one of the first interconnect lines, and wherein each second interconnect line is contiguous,
        after a third layer is deposited onto the second layer and into the second interconnect lines, scribe a plurality of third interconnect lines into the second layer and the third layer, wherein each of the third interconnect lines is located adjacent to one of the second interconnect lines, and
        scribe a plurality of isolation lines into the first, second, and third layers.

2. The system of claim 1, wherein at least one laser device generates laser pulses having 100 to 200 uJ of energy to scribe the isolation lines.

3. The system of claim 1, wherein at least one laser device generates laser pulses having a pulse width of 5 to 75 nanoseconds to scribe the isolation lines.

4. The system of claim 1, wherein the scribing of the isolation lines occurs subsequent to the scribing of the third interconnect lines.

5. A system for fabricating a solar-cell assembly, the system comprising:
    a translation stage operable to support the workpiece and translate the supported workpiece in a longitudinal direction;
    an encoder operatively coupled with the translation stage so as to measure a position of the translation stage;
    a laser operable to generate output able to remove material from at least a portion of the workpiece;
    a laser switch coupled with the laser so as to control the timing of the laser output by triggering the laser output; and
    a controller operatively coupled with the translation stage, the encoder, and the laser switch,
    wherein the controller is operable to trigger the laser switch in response to an encoder measured position of the translation stage to interrupt the formation of a laser-scribed line so as to skip over a previously-formed laser scribed line.

6. The system of claim 5, wherein the controller comprises a processor and a computer-readable medium that includes instructions that when executed cause the processor to accomplish said triggering of the laser switch.

7. A system for fabricating a solar-cell assembly, the system comprising:
    a support mechanism for receiving a workpiece;
    a laser operable to generate output able to remove material from at least a portion of the workpiece;
    a laser switch coupled with the laser so as to control the timing of the laser output by triggering the laser output;
    a scanning device operable to control a position of the output from the laser;
    an encoder operatively coupled with the scanning device so as to measure a position of the scanning device; and
    a controller operatively coupled with the scanning device, the encoder, and the laser switch,
    wherein the controller is operable to trigger the laser switch in response to an encoder measured position of the scanning device to interrupt the formation of a laser-scribed line so as to skip over a previously-formed laser scribed line.

8. The system of claim 7, wherein the controller comprises a processor and a computer-readable medium that includes instructions that when executed cause the processor to accomplish said triggering of the laser switch.

* * * * *